(12) United States Patent
Choi (10) Patent No.: US 7,920,001 B2
(45) Date of Patent: *Apr. 5, 2011

(54) SEMICONDUCTOR MEMORY DEVICE AND METHOD FOR OPERATING THE SAME

(75) Inventor: Hoon Choi, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/706,379

(22) Filed: Feb. 16, 2010

(65) Prior Publication Data

US 2010/0149892 A1   Jun. 17, 2010

Related U.S. Application Data

(63) Continuation of application No. 12/128,310, filed on May 28, 2008, now Pat. No. 7,688,124.

(30) Foreign Application Priority Data

Nov. 2, 2007 (KR) .......................... 10-2007-0111531

(51) Int. Cl.
*H03L 7/06* (2006.01)

(52) U.S. Cl. ....................................... 327/158; 327/149
(58) Field of Classification Search .................. 327/147, 327/149, 156, 158, 161
See application file for complete search history.

(56) References Cited

U.S. PATENT DOCUMENTS

| | | | |
|---|---|---|---|
| 7,477,716 B2 * | 1/2009 | Mai ............................. | 375/376 |
| 7,489,568 B2 * | 2/2009 | Kim et al. ................ | 365/189.12 |
| 7,688,124 B2 * | 3/2010 | Choi ........................... | 327/158 |
| 2009/0066379 A1 * | 3/2009 | Kim et al. .................... | 327/149 |
| 2009/0086876 A1 * | 4/2009 | Mai ............................. | 375/376 |
| 2010/0090732 A1 * | 4/2010 | Lee et al. ..................... | 327/156 |
| 2010/0214031 A1 * | 8/2010 | Yamamoto et al. ............ | 331/34 |

* cited by examiner

*Primary Examiner* — Lincoln Donovan
*Assistant Examiner* — Adam D Houston
(74) *Attorney, Agent, or Firm* — IP & T Group LLP (57) ABSTRACT

A semiconductor memory device has a DLL circuit capable of suppressing EMI without distorting a DLL clock required in high-speed operation. The semiconductor memory device includes a delay locked loop (DLL) circuit configured to be responsive to a system clock to output a DLL clock having a phase that is changed when electromagnetic interference (EMI) is detected, for the DLL clock to have frequencies within a delay locking range, and a data output circuit configured to output data in synchronization with the DLL clock.

6 Claims, 12 Drawing Sheets

SEMICONDUCTOR MEMORY DEVICE AND METHOD FOR OPERATING THE SAME

CROSS-REFERENCE TO RELATED APPLICATIONS

This application is a continuation of U.S. patent application Ser. No. 12/128,310 filed on May 28, 2008 now U.S. Pat. No. 7,688,124 which claims priority of Korean patent application Ser. No. 10-2007-0111531 filed on Nov. 2, 2007. The disclosure of each of the foregoing applications is incorporated herein by reference in its entirety.

BACKGROUND OF THE INVENTION

The present invention relates to a semiconductor memory device, and more particularly, to a delay locked loop (DLL) circuit capable of reducing electromagnetic interference (EMI) caused by a high-frequency internal clock, thus improving the reliability of operation of a semiconductor memory device.

In a system with a variety of semiconductor devices, a semiconductor memory device serves as data storage. The semiconductor memory device outputs data corresponding to addresses received from a data processor, e.g., a central processing unit (CPU), or stores data received from the data processor into memory cells selected by addresses inputted together with the data.

As the operating speed of the system continues to increase and semiconductor integrated circuit technologies continue to advance, semiconductor memory devices are being required to input and output data at higher speeds. For the purpose of high-speed data input and output, a synchronous memory device has been developed. The synchronous memory device inputs and outputs data in synchronization with a system clock. However, because even the synchronous memory device could not meet the required data input/output speed, a double data rate (DDR) synchronous memory device was developed. The DDR synchronous memory device outputs or inputs data at falling edges and rising edges of the system clock.

The DDR synchronous memory device must process two data during one cycle of the system clock so as to input and output data at a falling edge and a rising edge of the system clock. Specifically, the DDR synchronous memory device should output data exactly in synchronization with the rising edge and the falling edge of the system clock. To this end, a data output circuit of the DDR synchronous memory device outputs data in synchronization with rising and falling edges of the system clock inputted therein.

However, the system clock is inevitably delayed until it arrives at the data output circuit because it passes through a clock input buffer, a transfer line, and so on in the semiconductor memory device. Thus, if the data output circuit outputs data in synchronization with the delayed system clock, an external device will receive data that are not synchronized with rising edges and falling edges of the system clock.

To solve this problem, the semiconductor memory device uses a delay locked loop (DLL) circuit to lock a delay of a clock signal. The DLL circuit compensates for the delay caused by internal circuits of the semiconductor memory device until the system clock inputted to the semiconductor memory device is transferred to the data output circuit. The DLL circuit finds the delay time of the system clock, which is caused by the clock input buffer, the clock transfer line, etc. of the semiconductor memory device. Then, the DLL circuit delays the system clock according to the found delay time and outputs the delayed system clock to the data output circuit. That is, the DLL circuit outputs the delay-locked system clock to the data output circuit. The data output circuit outputs data in synchronization with the delay-locked system clock. Therefore, it seems that the data are correctly outputted to the external circuit in synchronization with the system clock.

In an actual operation, the delay-locked system clock is transferred to the data output circuit at a time point earlier by one period than a time point when the data must be outputted, and the data output circuit outputs data in synchronization with the received delay-locked system clock. In this way, it seems that the data are outputted exactly in synchronization with the rising and falling edges of the system clock inputted to the semiconductor memory device. That is, the DLL circuit is a circuit to find how fast the data should be outputted in order to compensate for the delay of the system clock within the semiconductor memory device.

Recently, as the semiconductor memory device is required to operate at a high speed, a frequency of the system clock inputted to the semiconductor memory device is gradually increasing. Thus, the DLL circuit should control the phase of the system clock more precisely and prevent the system clock from being distorted by jitter. However, a lot of elements are highly integrated within the semiconductor memory device and a high frequency clock causes unintended electromagnetic interference (EMI), leading to malfunction of the elements within the semiconductor memory device.

Figure 1:
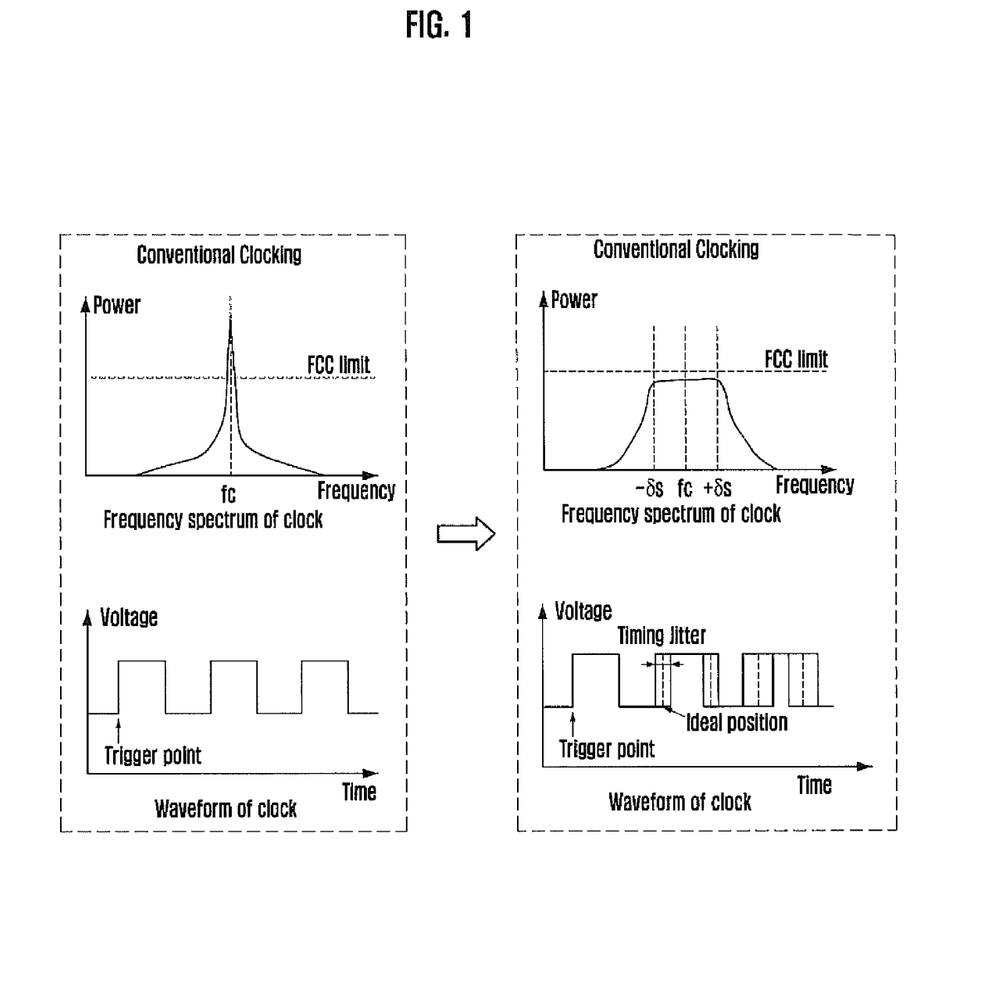
FIG. 1 is a conceptual diagram illustrating an operation of a spread spectrum of a clock.

FIG. 1 is a conceptual diagram illustrating an operation of a spread spectrum of a clock.

Specifically, FIG. 1 is a graph illustrating a power and a voltage with respect to a conventional clock in a frequency domain and a time domain, and also illustrating a power and a voltage with respect to a clock obtained by a spread spectrum in a frequency domain and a time domain. It can be seen from FIG. 1 that the degree of EMI is decreased after the spread spectrum.

The spread spectrum is a scheme that transmits information using a wider bandwidth than a theoretical bandwidth necessary to transmit the specific information. A usage efficiency of the frequency domain is low, but an error efficiency or signal-to-noise (S/N) ratio is good. Furthermore, if the frequency of the clock is correctly locked, EMI is concentrated on the corresponding frequency. This may affect peripheral devices and exceed limits recommended in the regulation of EMI. For these reasons, energy is dispersed by making the frequency of the clock changed within a predetermined range, instead of exactly locking. In this way, the problem of EMI can be solved.

Referring to FIG. 1, when the conventional clock has a single frequency, the power of the clock in the frequency domain exceeds the guideline level in respect to EMI of the Federal Communications Commission (FCC), i.e., FCC limit. When the semiconductor memory device operates at a low frequency or has a low integration density, problems caused by the EMI may be slight. However, in semiconductor memory devices recently developed, malfunction of internal elements due to the EMI may incur serious problems. Therefore, jitter components are intentionally inserted into the clock through a spread spectrum, thus making the frequency of the clock spread within a predetermined range. The predetermined range where the frequency of the clock can be spread is limited to a range where an error does not occur in inputting/outputting data corresponding to the received command and address.

Figure 2:
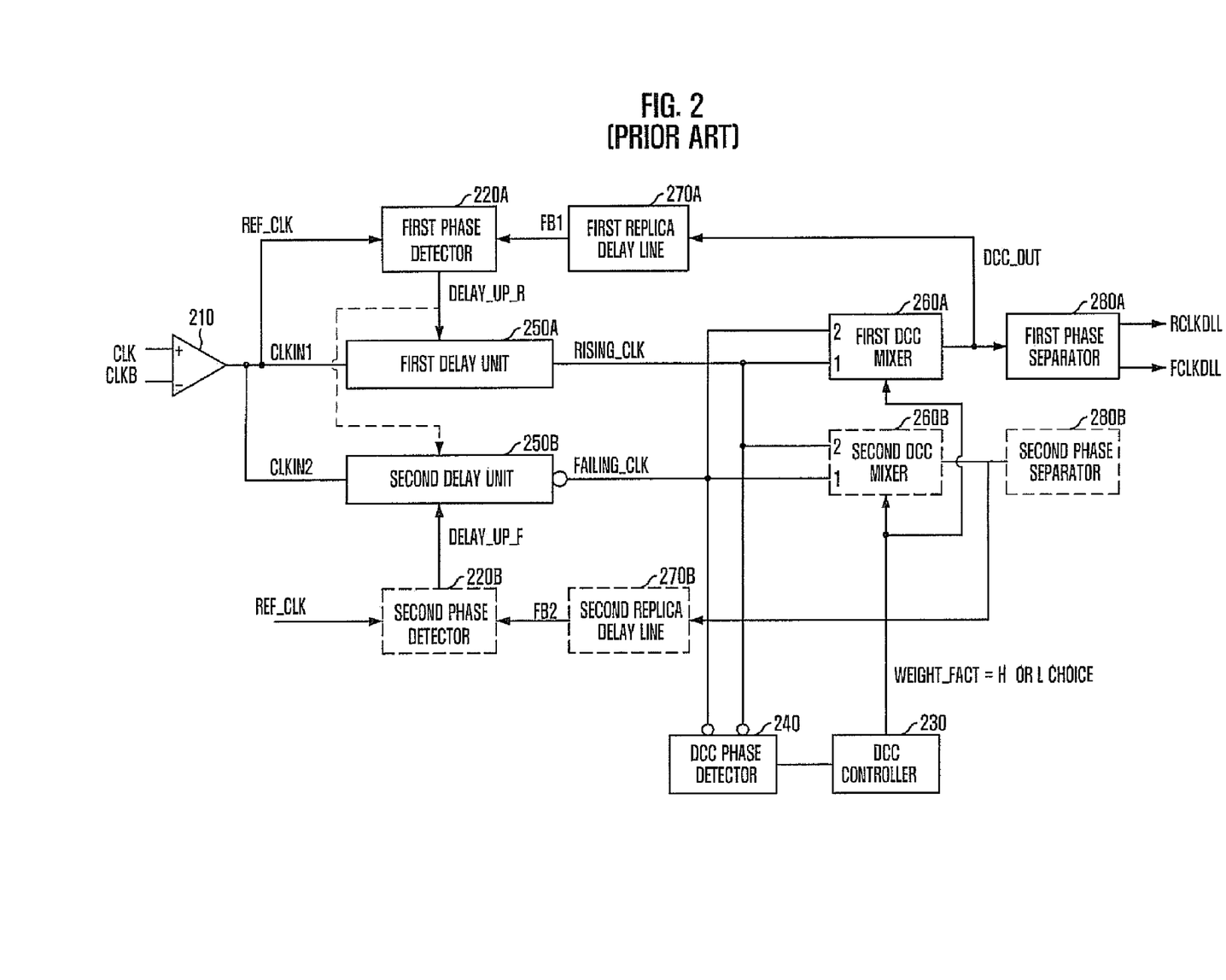
FIG. 2 is a block diagram of a DLL circuit in a conventional semiconductor memory device.

FIG. 2 is a block diagram of a DLL circuit in a conventional semiconductor memory device.

Referring to FIG. 2, the DLL circuit includes an input buffer 210, first and second delay units 250A and 250B, first and second phase detectors 220A and 220B, first and second replica delay lines 270A and 270B, first and second duty cycle correction (DCC) mixers 260A and 260B, a DCC phase detector 240, a DCC controller 230, and first and second phase separators 280A and 280B. The second phase separator 280B is not essential but optional.

The input buffer 210 receives first and second system clocks CLK and CLKB from the outside and outputs first and second internal clocks CLKIN1 and CLKIN2 to the first and second delay units 250A and 250B. The first delay unit 250A generates a rising delay clock RISING_CLK by delaying the first internal clock CLKIN1 by an amount of delay determined by a first delay update signal DELAY_UP_R outputted from the first phase detector 220A, and outputs the generated rising delay clock RISING_CLK to the first and second DCC mixers 260A and 260B. The second delay unit 250B generates a falling delay clock FALLING_CLK by delaying the second internal clock CLKIN2 by an amount of delay determined by a second delay update signal DELAY_UP_F outputted from the second phase detector 220B, and outputs the generated falling delay clock FALLING_CLK to the first and second DCC mixers 260A and 260B.

The first and second DCC mixers 260A and 260E corrects the duty cycle ratios of the rising delay clock RISING_CLK and the falling delay clock FALLING_CLK. The DCC phase detector 240 detects the phases of the rising delay clock RISING_CLK and the falling delay clock FALLING_CLK, and outputs their duty cycle ratios to the DCC controller 230. The DCC controller 230 controls the first and second DCC mixers 260A and 260B, considering weight factors for correcting the duty cycle ratios. The first and second DCC mixers 260A and 260B correct the input clock to a duty cycle ratio of 50:50 and outputs a DCC clock DCC_OUT to the first and second phase separators 280A and 280B and the first and second replica delay lines 270A and 270B. Finally, the first phase separator 280A outputs rising and falling DLL clocks RCLKDLL and FCLKDLL respectively in synchronization with the rising and falling edges of the system clock CLK on the basis of the DCC clock DCC_OUT.

The first and second replica delay lines 270A and 270B models a time that is taken until an inputted system clock is transferred through the buffer and the clock input/output path to the data output circuit. It is usual to use replica of components existing on a clock path. Feedback clocks FB1 and FB2 outputted from the first and second replica delay lines 270A and 270B are inputted to the first and second phase detectors 220A and 220B, respectively. The first phase detector 220A compares a phase of a reference clock REF_CLK from the input buffer 210 with a phase of the feedback clock FB1 and outputs the first delay update signal DELAY_UP_R, which is used for the first delay unit 250A to determine the amount of delay of the first internal clock CLKIN1. The second phase detector 220B compares a phase of the reference clock REF_CLK from the input buffer 210 with a phase of the feedback clock FB2 and outputs the second delay update signal DELAY_UP_F, which is used for the second delay unit 250B to determine the amount of delay of the second internal clock CLKIN2.

When the first phase detector 220A detects the phase locking, it maintains the state without controlling the determined amount of delay. At this point, the second phase detector 220B stops its operation in order to reduce the power consumption. In FIG. 2, the second DCC mixer 260B and the second replica delay line 270B, which stops their operations in order to reduce the power consumption in the phase locked state, are indicated by dotted lines.

Figure 3:
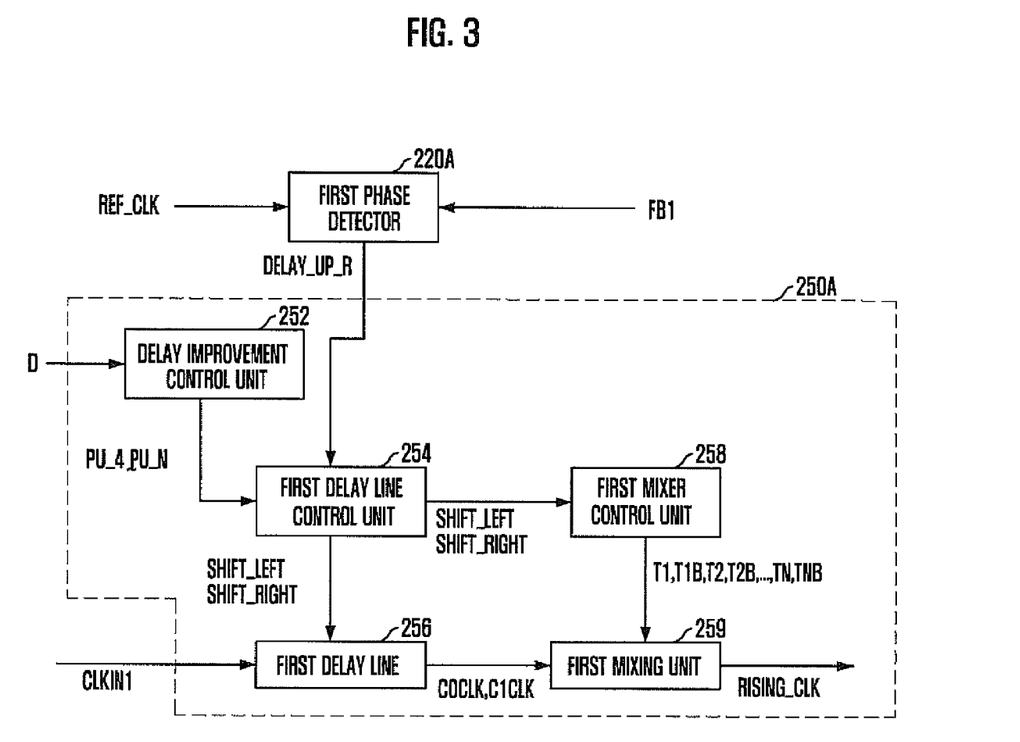
FIG. 3 is a block diagram illustrating a first delay unit of FIG. 2.

FIG. 3 is a block diagram illustrating the first delay unit 250A of FIG. 2.

Referring to FIG. 3, the first delay unit 250A receiving the first delay update signal DELAY_UP_R includes a delay improvement control unit 252, a first delay line control unit 254, a first delay line 256, a first mixer control unit 258, and a first mixing unit 259.

The delay improvement control unit 252 receives an internal periodic signal D and outputs, to the first line control unit 254, periodic signals PU_4 to PU_N whereby a period of varying an amount of delay of the first delay line 256 is determined. The first delay line control unit 254 receives the first delay update signal DELAY_UP_R and outputs delay control signals SHIFT_LEFT and SHIFT_RIGHT to the first delay line 256 according to the periodic signals PU_4 to PU_N outputted from the delay improvement control unit 252. The first delay line 256 controls the amount of delay by making the first internal clock CLKIN1 pass through a different number of unit delay elements according to the delay control signals SHIFT_LEFT and SHIFT_RIGHT. First and second internal delay clocks C0CLK and C1CLK outputted from the first delay line 256 have a phase difference corresponding to the amount of delay of the unit delay elements. Thereafter, the phases of the first and second internal delay clocks C0CLK and C1CLK are finely readjusted by the first mixing unit 259. The first mixer control unit 258 controlling the first mixing unit 259 receives the delay control signals SHIFT_LEFT and SHIFT_RIGHT from the first delay line control unit 254 and outputs fine control signals T1, T1B, T2, T2B, . . . , TN, TNB. In response to the fine control signals T1, T1B, T2, T2B, . . . , TN, TNB, the phases of the first and second internal delay clocks C0CLK and C1CLK in controlled by an Nth of the amount of delay of the unit delay elements of the first delay line 256 (where N is a natural number). The first mixing unit 259 finely adjusts the phases of the first and second internal delay clocks C0CLK and C1CLK up to 1/N unit of the amount of delay of the unit delay elements included in the first delay line 256, and outputs the rising delay clock RISING_CLK a phase of which is locked to that of the reference clock REF_CLK.

As is well known to those skilled in the art, the first delay line control unit 254 and the first delay line 256 of the first delay unit 250A are generally used in the DLL circuit of the semiconductor memory device, and thus their detailed circuit configurations will be omitted herein. The delay improvement control unit 252, the first mixer control unit 258, and the first mixing unit 259 will be described in more detail hereinafter.

Figure 4A:
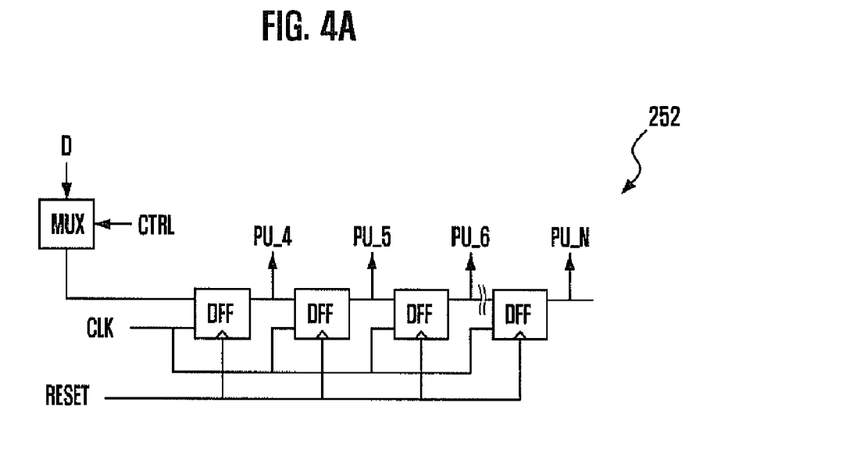
FIG. 4A is a block diagram illustrating a delay improvement control unit of FIG. 3.

FIG. 4A is a block diagram illustrating the delay improvement control unit 252 of FIG. 3.

Referring to FIG. 4A, the delay improvement control unit 252 includes a multiplexer and a plurality of flip-flops. The multiplexer transfers the internal periodic signal D in response to a control signal CTRL. The flip-flops receive an output signal of the multiplexer and output the periodic signals PU_4 to PU_N in response to the system clock CLK.

During the operation of the DLL circuit, the first phase detector 220A continues to compare a phase of the feedback clock FB1 and a phase of the reference clock REF_CLK and outputs the first delay update signal DELAY_UP_R according to the comparison result. A value of the first delay update signal DELAY_UP_R may continuously change. Accordingly, if the amount of delay of the first delay line 256 changes whenever the value of the first delay update signal DELAY_UP_R changes, power consumption may increase excessively. Furthermore, when the phase difference between the feedback clock FB1 and the reference clock REF_CLK is not great, the output of the first phase detector 220A may be inconsistent due to the change in the amount of delay of the first delay line 256. Thus, the first phase detector 220A may repetitively output contradictory results. In this case, changing the delay value of the first delay line 256 may prevent the DLL circuit from going to the phase locked state. Hence, in case that the first phase detector 220A outputs the same results during several periods of the system clock CLK, it is determined that the first delay update signal DELAY_UP_R is valid and the delay improvement control unit 252 enables the first delay line control unit 254. A reset signal RST applied to each flip-flop is activated when the DLL circuit is initialized. The reset signal RST may be activated when the mode of operation of the semiconductor memory device is changed, or a DLL operation is again performed after the phase locking.

Figure 4B:
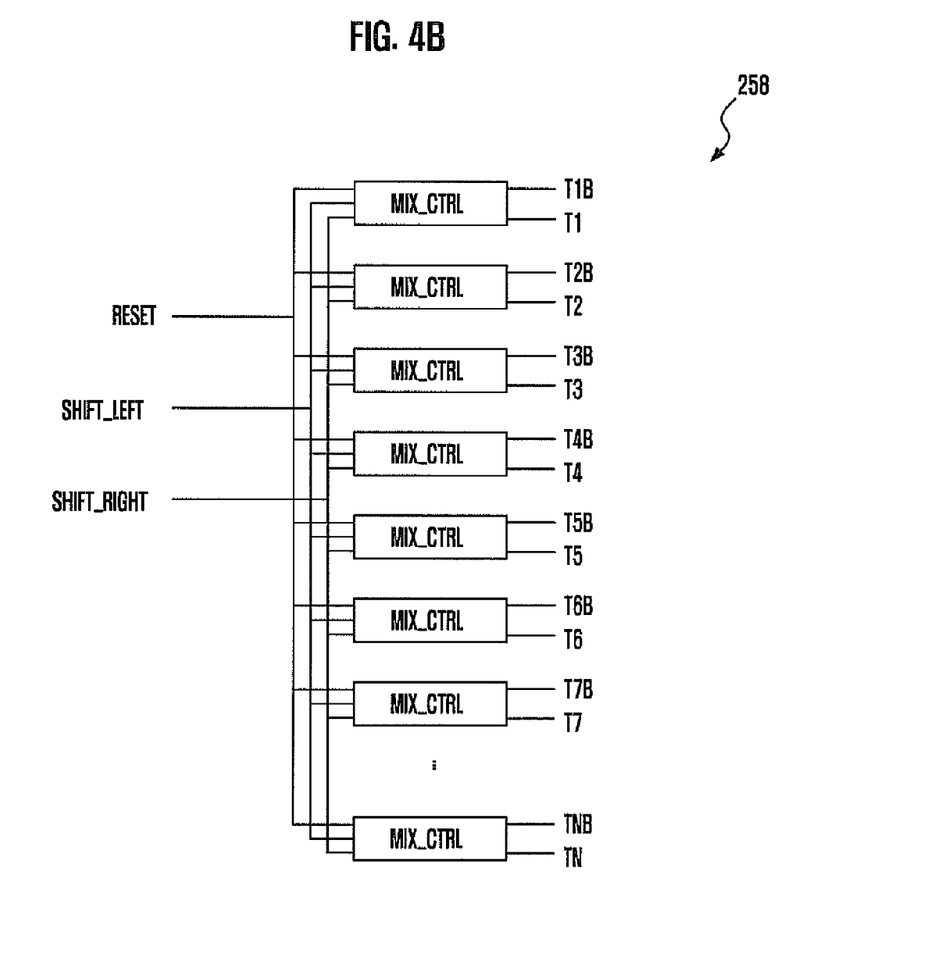
FIG. 4B is a block diagram illustrating a first mixer control unit of FIG. 3.

FIG. 4B is a block diagram illustrating the first mixer control unit 258 of FIG. 3.

Referring to FIG. 4B, the first mixer control unit 258 includes a plurality of unit phase mixer control units. The unit phase mixer control units receive the delay control signals SHIFT_LEFT and SHIFT_RIGHT from the first delay line control unit 254 and respectively output the fine control signals T1 and T1B, T2 and T2B, . . . , TN and TNB for controlling unit phase mixers of the first mixing unit 259.

Figure 4C:
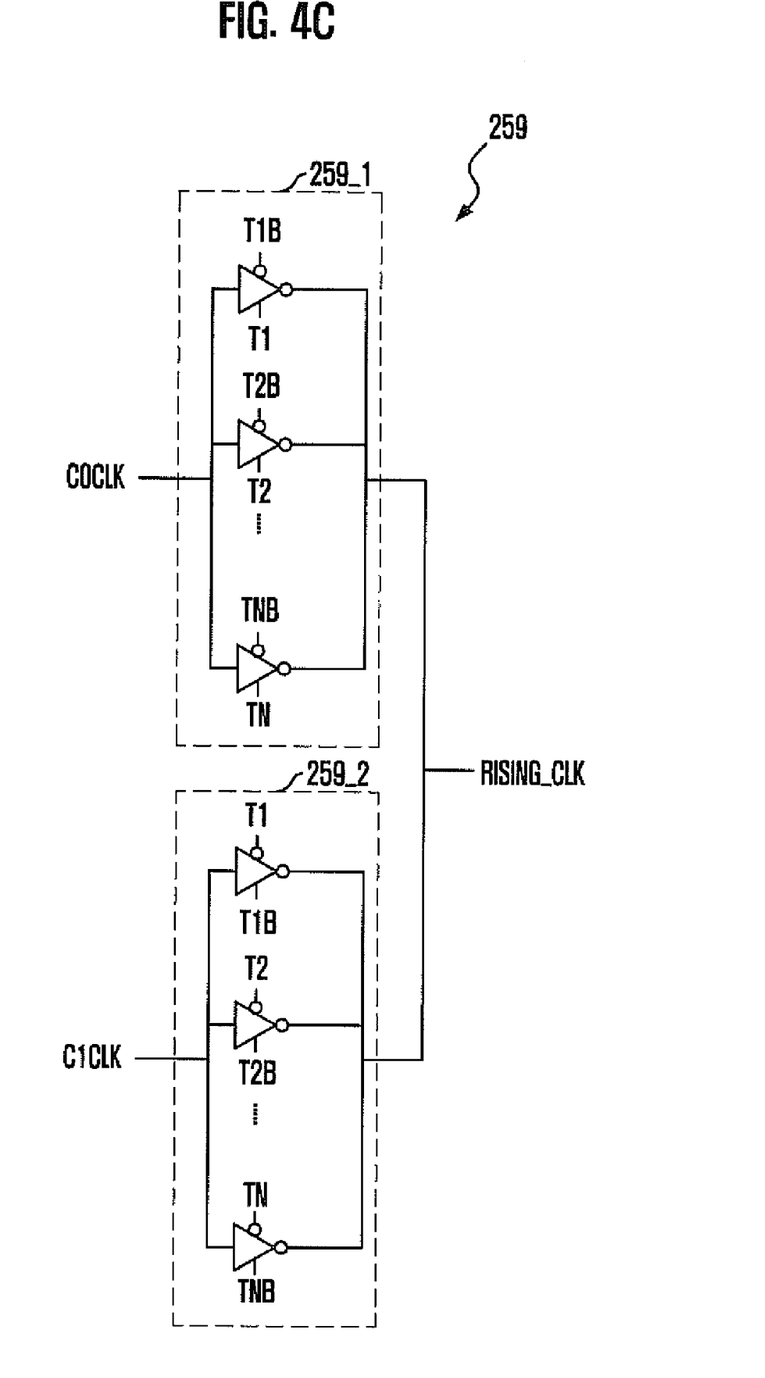
FIG. 4C is a circuit diagram illustrating a first mixing unit of FIG. 3.

FIG. 4C is a circuit diagram illustrating the first mixing unit 259 of FIG. 3.

Referring to FIG. 4C, the first mixing unit 259 includes first and second phase mixers 259_1 and 259_2 each having a plurality of unit phase mixers.

The unit phase mixer is implemented with a 3-state inverter for controlling a transfer speed of an input signal in response to the fine control signal. The first phase mixer 259_1 includes N number of the unit phase mixer connected in parallel with respect to the first internal delay clock C0CLK, and the second phase mixer 259_2 includes N number of the unit phase mixer connected in parallel with respect to the second internal delay clock C1CLK. Since the N unit phase mixers connected in parallel have different signal drivability according to the fine control signals T1 and T1B, T2 and T2B, . . . , TN and TNB, they can change phase transition speed while phases of the first and second internal delay clocks C0CLK and C1CLK are changed. For example, the delay value of the first mixing unit 259 becomes minimum when the N unit phase mixers are all enabled to transfer the first internal delay clock C0CLK, and it becomes maximum when one unit phase mixer is enabled.

When M unit phase mixers in the first phase mixer 259_1 (where M is greater than 1 and less than N) are enabled, (N−M) unit phase mixers in the second phase mixer 259_2 are enabled. The signals outputted from the first and second phase mixers 259_1 and 259_2 are merged to output the rising delay clock RISING_CLK. In this way, the first mixing unit 259 can achieve the phase control up to 1/N unit of the amount of delay of the unit delay elements included in the first delay line 256.

Figure 5:
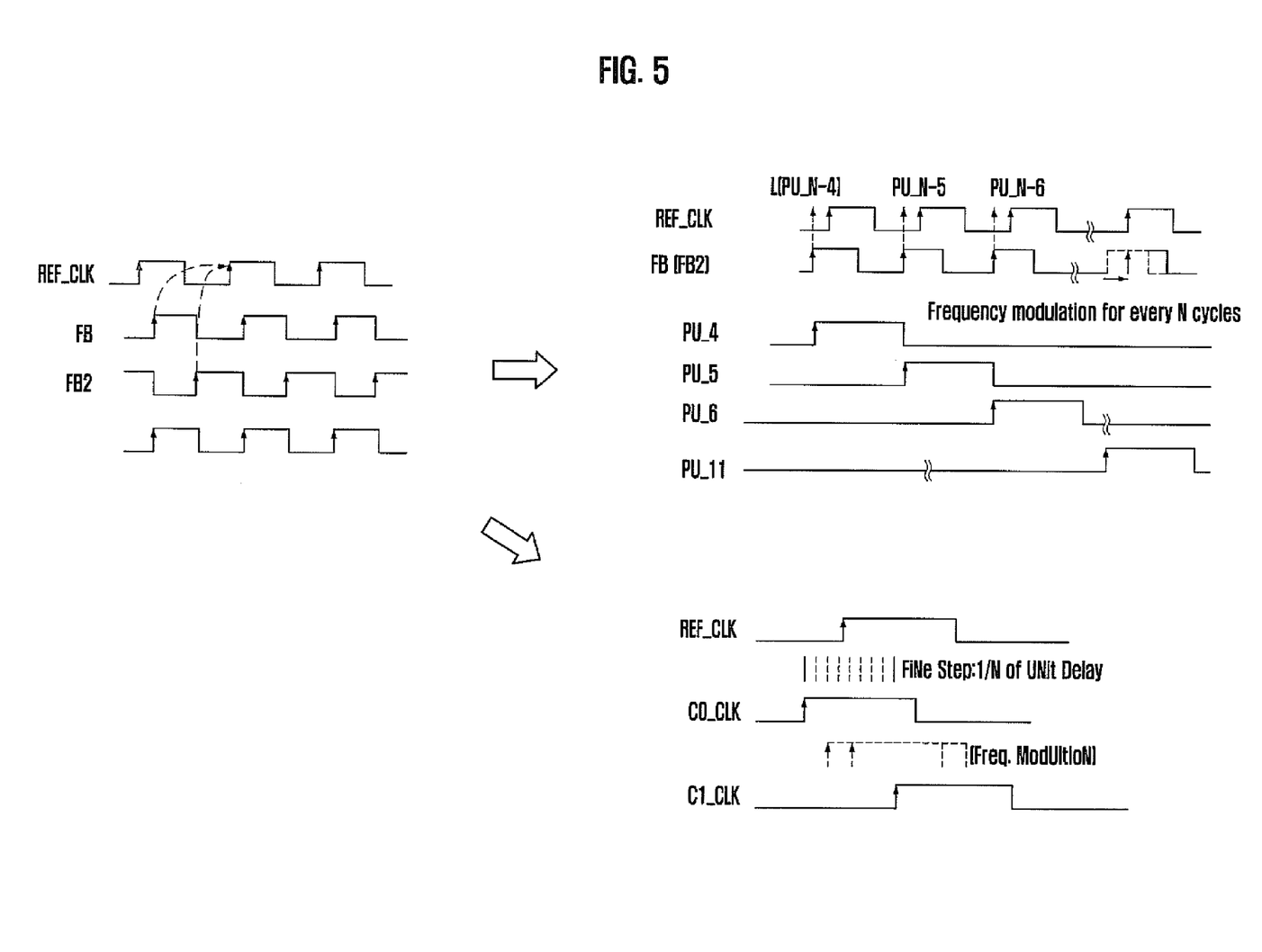
FIG. 5 is a timing diagram illustrating the operation of the semiconductor memory device of FIG. 2.

FIG. 5 is a timing diagram illustrating the operation of the semiconductor memory device of FIG. 2.

Referring to FIG. 5, the first phase detector 220A compares the phase of the reference clock REF_CLK with the phase of the feedback clock FB1, and the second phase detector 220B compares the phase of the reference clock REF_CLK with the phase of the feedback clock FB2. The comparison results outputted from the first and second phase detectors 220A and 220B are used to control the amount of delay of the first and second delay units 250A and 250B. Referring to the first delay unit 250A as an example, the amount of delay of the first delay unit 250A is firstly controlled according to the comparison result in response to the periodic signals PU_4 to PU_N outputted from the delay improvement control unit 252. The first mixing unit 259 finely readjusts the controlled amount of delay of the first delay unit 250A. Thus, the DLL circuit of the conventional semiconductor memory device can achieve the fine phase locked state. The rising and falling DLL clocks RCLKDLL and FCLKDLL outputted from the DLL circuit become a finely-phase-controlled signal have a single frequency.

As described above, the phases of the rising and falling DLL clocks RCLKDLL and FCLKDLL outputted from the DLL circuit of the conventional semiconductor memory device can be finely controlled. As semiconductor memory devices use system clocks having high frequencies, the rising and falling DLL clocks RCLKDLL and FCLKDLL having finely controlled phases are very advantageous to controlling data output timings.

However, when the rising and falling DLL clocks RCLKDLL and FCLKDLL having the finely controlled phases are analyzed in the frequency domain, the power of the rising and falling DLL clocks RCLKDLL and FCLKDLL may exceed the FCC limit as described in FIG. 1. This may cause EMI in highly integrated semiconductor memory devices using system clocks with high frequencies, leading to malfunction of internal elements.

SUMMARY OF THE INVENTION

Embodiments of the present invention are directed to providing a semiconductor memory device having a DLL circuit capable of suppressing EMI without distorting a DLL clock required in high-speed operation.

In accordance with an aspect of the present invention, there is provided a semiconductor memory device, comprising a delay locked loop (DLL) circuit configured be responsive to a system clock to output a DLL clock having a phase that is changed when electromagnetic interference (EMI) is detected, for the DLL clock to have frequencies within a delay locking range, and a data output circuit configured to output data in synchronization with the DLL clock.

In accordance with another aspect of the present invention, there is provided a semiconductor memory device, comprising an input buffer configured to buffer a system clock to output a first internal clock corresponding to a rising edge of the system clock and a second internal clock corresponding to a falling edge of the system clock, a first internal delay circuit configured to perform a DLL operation on the first internal clock and output a DLL clock having a frequency band varying within a delay locking range, by changing a phase of the DLL clock when electromagnetic interference (EMI) is detected, and a second internal delay circuit configured to perform a DLL operation on the second internal clock and turned off when the first internal delay circuit completes the DLL operation.

In accordance with further aspect of the present invention, there is provided a semiconductor memory device, comprising a phase detector configured to compare a phase of a reference clock with a phase of a feedback clock, a delay unit configured to reduce the phase difference by delaying a phase of a system clock according to an output of the phase detector and to output the feedback clock, and an electromagnetic interference (EMI) detector configured to determine an EMI radiation caused by the feedback clock by detecting if the outputs of the phase detector are equal during a predetermined period.

In accordance with further aspect of the present invention, there is provided a method for operating a semiconductor memory device, the method comprising changing a phase of a system clock when generation of electromagnetic interference (EMI) is detected, and outputting a delay locked loop (DLL) clock having a frequency band within a delay locking range, and outputting data in synchronization with the DLL clock.

The DLL circuit of the present invention in the semiconductor memory device using the system clock with a high frequency can suppress EMI caused when the DLL clock for controlling a data output timing has one fixed frequency. To this end, the conditions that the DLL clock may have one fixed frequency are detected and some of reset signals are activated for spread spectrum of the DLL clock, so that the frequency cannot be fixed through the fine phase control even in a phase locking state. The phase of the clock is changed within a narrow range. In this way, EMI can be prevented and the delay locking range for controlling the data input/output timing is not exceeded, thereby preventing the malfunction of the high-speed semiconductor memory device.

DESCRIPTION OF SPECIFIC EMBODIMENTS

Hereinafter, a semiconductor memory device in accordance with the present invention will be described in detail with reference to the accompanying drawings.

Figure 6:
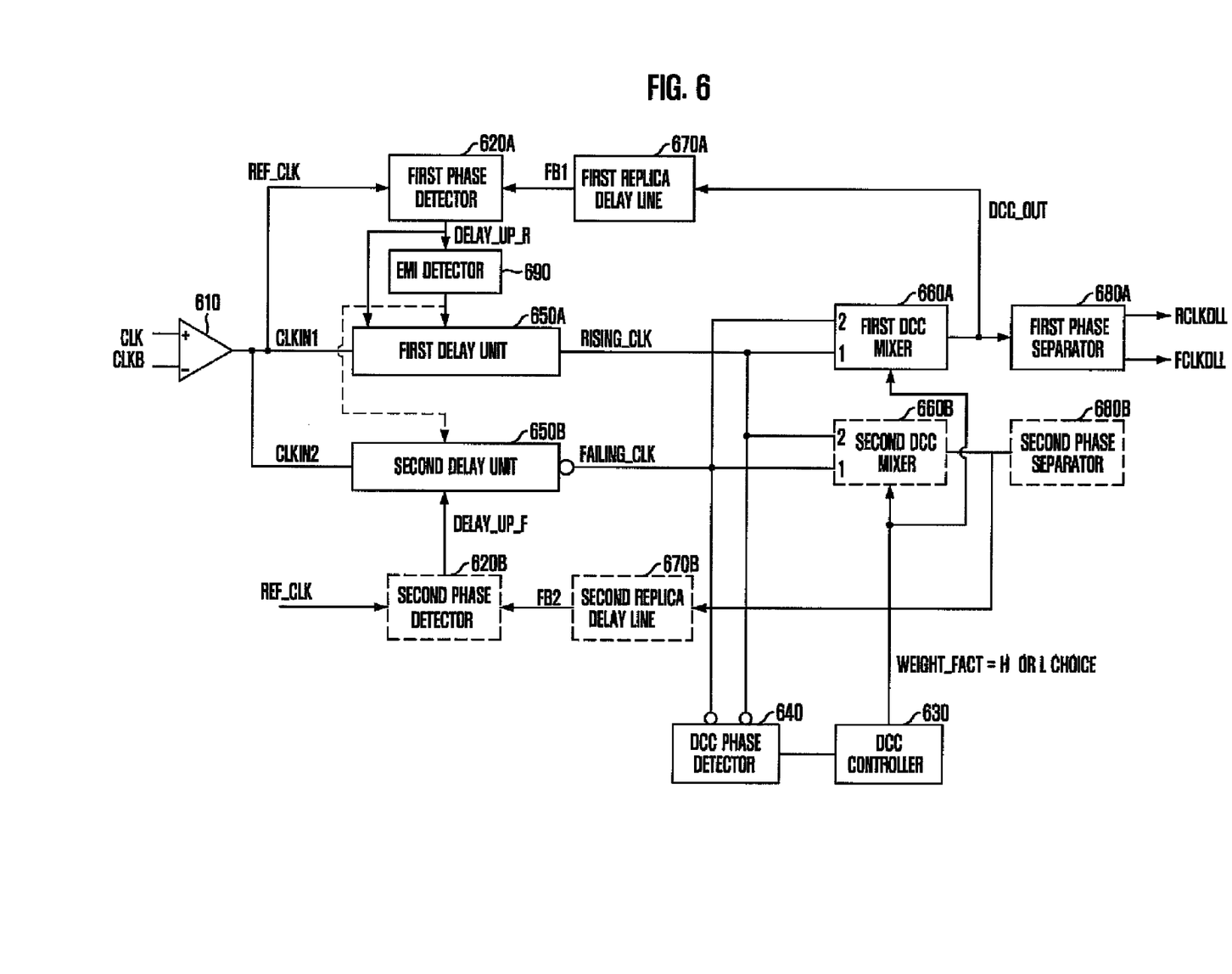
FIG. 6 is a block diagram illustrating a DLL circuit of a semiconductor memory device in accordance with an embodiment of the present invention.

FIG. 6 is a block diagram illustrating a delay locked loop (DLL) circuit of a semiconductor memory device in accordance with an embodiment of the present invention.

Referring to FIG. 6, the DLL circuit includes an input buffer 610, first and second delay units 650A and 650B, first and second phase detectors 620A and 620B, an EMI detector 690, first and second replica delay lines 670A and 670B, first and second duty cycle correction (DCC) mixers 660A and 660B, a DCC phase detector 640, a DCC controller 630, and first and second phase separators 680A and 680B. The second phase separator 680 is not essential but optional.

The DLL circuit receives system clocks CLK and CLKB and makes DLL clocks RCLKDLL and FCLKDLL have a frequency band within a delay locked range by changing the phases of the clocks when EMI occurs. Examples of the EMI problems include a case where electromagnetic wave is radiated above a predetermined level. While the conventional DLL circuit generates the DLL clocks with a single frequency (i.e., a locked phase) by compensating the amount of delay of the system clock, the DLL circuit in accordance with the present invention generates the DLL clocks RCLKDLL and FCLKDLL with a predetermined frequency band, which do not depart from the delay locked range and are not fixed to a single frequency so as to prevent the malfunction of peripheral circuits due to EMI. The delay locked range represents an allowable phase range of the DLL clocks RCLKDLL and FCLKDLL for a semiconductor memory device in determining the preferable output timing of data, that is, a phase error range that the DLL clocks RCLKDLL and FCLKDLL can have after the DLL operation. Although not shown, the semiconductor memory device includes a data output circuit that outputs data of unit cells in synchronization with the DLL clocks RCLKDLL and FCLKDLL outputted from the DLL circuit.

The structure and operation of the DLL circuit will be described below with reference to FIG. 6. The input buffer 610 receives the first and second system clocks CLK and CLKB from the outside and outputs the first and second internal clocks CLKIN1 and CLKIN2 to first and second delay units 650A and 650B. The first delay unit 650A generates a rising delay clock RISING_CLK by delaying the first internal clock CLKIN1 by the amount of delay determined by a first delay update signal DELAY_UP_R outputted from the first phase detector 620A and outputs the generated rising delay clock RISING_CLK to the first and second DCC mixers 660A and 660B. The second delay unit 650B generates a falling delay clock FALLING_CLK by delaying the second internal clock CLKIN2 by the amount of delay determined by a second delay update signal DELAY_UP_F outputted from the second phase detector 620B and outputs the generated falling delay clock FALLING_CLK to the first and second DCC mixers 660A and 660B.

The first and second DCC mixers 660A and 660B compensate the duty cycle ratios of the rising delay clock RISING_CLK and the falling delay clock FALLING_CLK. The DCC phase detector 640 detects the phases of the rising delay clock RISING_CLK and the falling delay clock FALLING_CLK, and reports the duty cycle ratios to the DCC controller 630. The DCC controller 630 controls the first and second DCC mixers 660A and 660B, considering the weight factors for correcting the duty cycle ratios. DCC clock DCC_OUT whose duty ratio is corrected to 50:50 by the first and second DCC mixers 660A and 660B is transferred to the first and second phase separators 680A and 680B and the first and second replica delay lines 670A and 670B. Finally, the first phase separator 680A outputs rising and falling DLL clocks RCLKDLL and FCLKDLL respectively in synchronization with the rising and falling edges of the system clock CLK on the basis of the DCC clock DCC_OUT.

The first and second replica delay lines 670A and 670B models a time that is taken until an input system clock is transferred through the buffer and the clock input/output path to the data output circuit. It is usual to use replica of components existing on a clock path. Feedback clocks FB1 and FB2 outputted from the first and second replica delay lines 670A and 670B are inputted to the first and second phase detectors 620A and 620B, respectively. The first phase detector 620A compares the phase of a reference clock REF_CLK from the input buffer 610 with the phase of the feedback clock FB1 and outputs the first delay update signal DELAY_UP_R, which is used for the first delay unit 650A to determine the amount of delay of the first internal clock CLKIN1. The second phase detector 620B compares the phase of the reference clock REF_CLK from the input buffer 610 with the phase of the feedback clock FB2 and outputs the second delay update signal DELAY_UP_F, which is used for the second delay unit 650B to determine the amount of delay of the second internal clock CLKIN2.

The first delay update signal DELAY_UP_R outputted from the first phase detector 620A is inputted to the EMI detector 690 as well as the first delay unit 650A. The EMI detector 690 determines the generation of EMI by using the output of the first phase detector 620A. When it is determined that the EMI will be generated, the EMI detector 690 outputs an EMI control signal EMI_CONTROL to the first delay unit 650A so as to perform the spread spectrum on the DLL clocks RCLKDLL and FCLKDLL to make them have a predetermined frequency band within a delay locked range, not a single frequency.

Referring to FIG. 6, the DLL circuit can be divided into a first internal delay circuit and a second internal delay circuit. The first internal delay circuit performs a DLL operation on the first internal clock CLKIN1 and outputs the DLL clock, and the second internal delay circuit performs a DLL operation on the second internal clock CLKIN2. By separately performing the DLL operations on the first internal clock CLKIN1 and the second internal clock CLKIN2, the first and second delay units 650A and 650B can achieve the delay locking more rapidly and the first and second DCC mixers 660A and 660B have an advantage for correcting the duty ratio to 50:50. However, these separate DLL operations cause high power consumption. If the first phase detector 620A detects the phase locking, both of the first and second delay units need not control the amount of delay any more. Thus, the second phase detector 620B stops its operation so as to reduce the power consumption. That is, the second internal delay circuit including the second DCC mixer 660B and the second replica delay line 670 stops its operation in the delay locked state.

Figure 7:
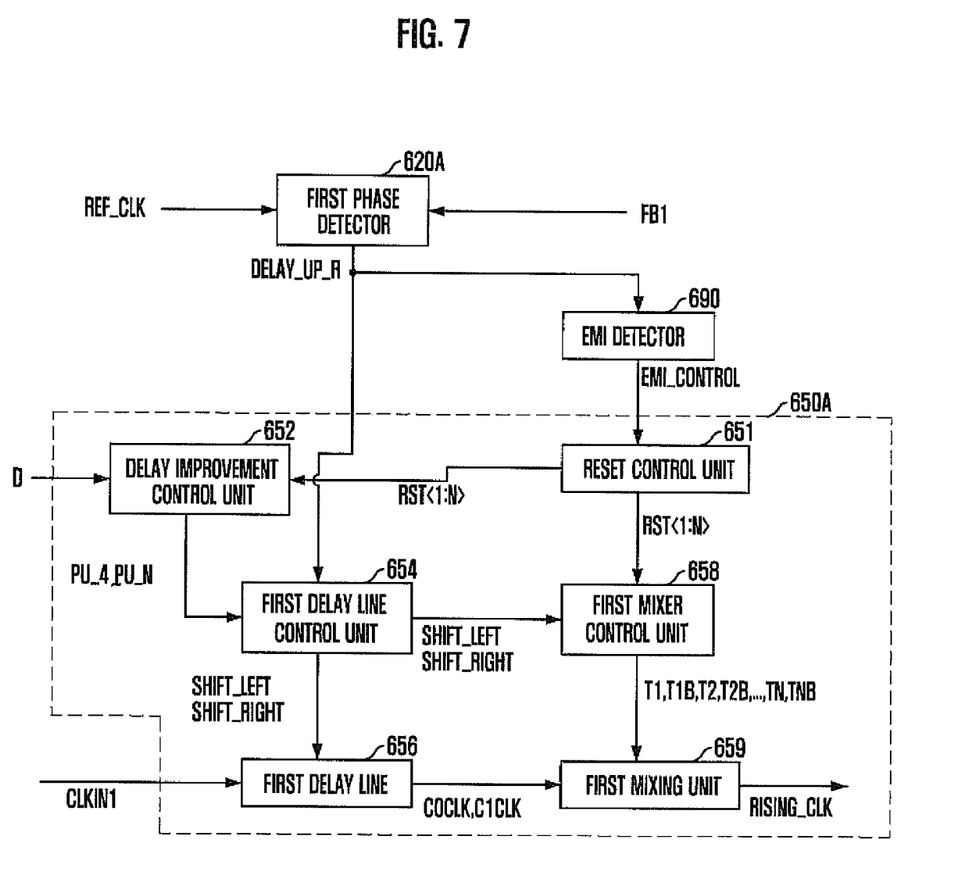
FIG. 7 is a block diagram illustrating a first delay unit of FIG. 6.

FIG. 7 is a block diagram illustrating the first delay unit 650A of FIG. 6.

Referring to FIG. 7, the first delay unit 650A receiving the first delay update signal DELAY_UP_R and the EMI control signal EMI_CONTROL includes a reset control unit 651, a delay improvement control unit 652, a first delay line control unit 654, a first delay line 656, a first mixer control unit 658, and a first mixing unit 659.

The reset control unit 651 activates some predetermined signals of N reset signals RST<1:N> in response to the EMI control signal EMI_CONTROL. When it is necessary to rest the whole DLL circuit, all the N reset signals RST<1:N> are activated. However, when the EMI control signal EMI_CONTROL is activated and thus the EMI radiation is expected to exceed the limit, only some of the reset signals RST<1:N> are activated. In this way, the timing of operation of the first delay line 656 is controlled and the operation of the first mixing unit 659 is hindered, thereby preventing the frequency of the rising DLL clock RISING_CLK from being locked. Since it is apparent to those skilled in the art that the circuit configurations of the reset control unit 651 for activating some of the N reset signals RST<1:N> in response to the EMI control signal EMI_CONTROL can be designed in various ways, their detailed description will be omitted.

The delay improvement control unit 652 receives an internal periodic signal D and outputs periodic signals PU_4 to PU_N to the first delay line control unit 654 so as to determine the period of varying the amount of delay of the first delay line 656. Some of the periodic signals PU_4 to PU_N are reset by some activated signals of the N reset signals RST<1:N> outputted from the reset control unit 651. Thus, the operation of the first delay line control unit 654 can be preceded or followed. The first delay line control unit 654 receives the first delay update signal DELAY_UP_R in response to the periodic signals PU_4 to PU_N and outputs delay control signals SHIFT_LEFT and SHIFT_RIGHT for controlling the amount of delay of the first delay line 656. The first delay line 656 controls the amount of delay by changing the number of unit delay elements which the first internal clock CLKIN1 passes through according to the delay control signals SHIFT_LEFT and SHIFT_RIGHT. First and second internal delay clocks C0CLK and C1CLK outputted from the first delay line 656 have a phase difference corresponding to the amount of delay of the unit delay elements. The phases of the first and second internal delay clocks C0CLK and C1CLK are finely readjusted by the first mixing unit 659.

The N reset signals RST<1:N> outputted from the reset control unit 651 are also inputted to the first mixer control unit 658 for controlling the first mixing unit 659. The first mixer control unit 658 receives the delay control signals SHIFT_LEFT and SHIFT_RIGHT from the first delay line control unit 654 and outputs fine control signals T1 and T1B, T2 and T2B, . . . , TN and TNB for phase control by a Nth of the amount of delay of the unit delay elements included in the first delay line 656 (where N is a natural number). The first mixing unit 659 finely adjusts the phases of the first and second internal delay clocks C0CLK and C1CLK up to 1/N unit of the amount of delay of the unit delay elements included in the first delay line 656 in response to the fine control signals T1 and T1B, T2 and T2B, . . . , TN and TNB, and outputs the rising delay clock RISING_CLK a phase of which is locked to that of the reference clock REF_CLK. When some of the N reset signals RST<1:N> are activated, the fine control signals corresponding to the activated reset signals are reset.

Figure 8:
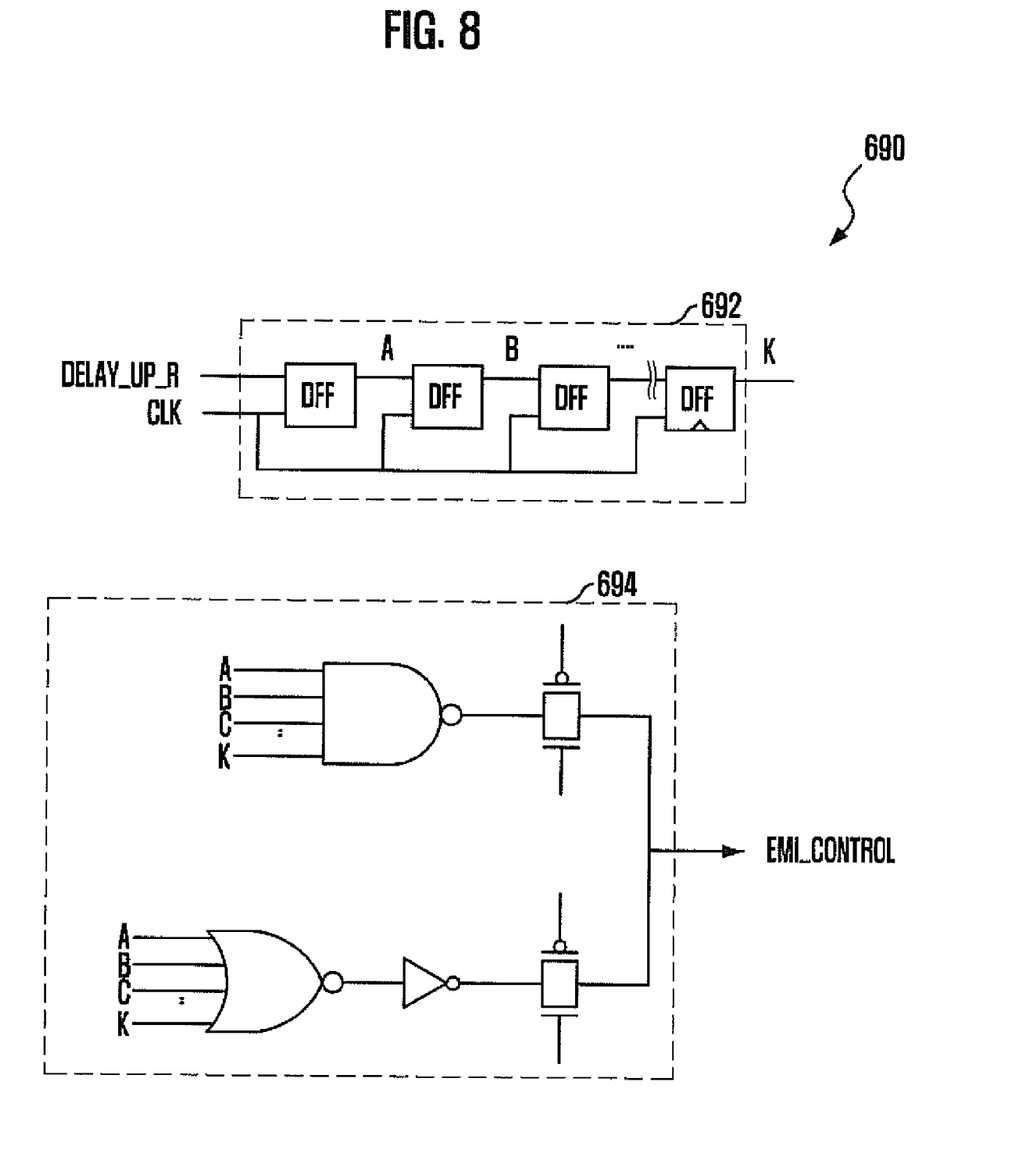
FIG. 8 is a circuit diagram illustrating an EMI detector of FIG. 6.

FIG. 8 is a circuit diagram illustrating the EMI detector 690 of FIG. 6. The EMI detector 690 detects if the first delay update signal DELAY_UP_R outputted from the first phase detector 620A has the same result during a predetermined period, and determines the EMI radiation possibility caused by the rising delay clock RISING_CLK or the DLL clocks RCLKDLL and FCLKDLL. In particular, when the output of the first phase detector 620A is equal during a predetermined period, the EMI detector 690 judges the case as the EMI radiation and hinders the DLL operation.

As illustrated in FIG. 8, the EMI detector 690 includes a result storing unit 692 and a logical combination unit 694. The result storing unit 692 stores the outputs of the first phase detector 620A during K periods of the system clock CLK (where K is a natural number). When the K outputs stored in the result storing unit 692 are all equal, the logical combination unit 694 determines that the EMI will be generated. For example, when the first delay update signal DELAY_UP_R is inputted with a logic high level or a logic low level during K periods, the EMI control signal EMI_CONTROL is activated to a logic low level. On the other hand, when the first delay update signal DELAY_UP_R transitions at least one time during the k periods, the EMI control signal EMI_CONTROL is deactivated to a logic high level.

More specifically, the result storing unit 692 includes K flip-flops connected in series to transfer the first delay update signal DELAY_UP_R in response to the system clock CLK. The flip-flops output a value K of the first delay update signal DELAY_UP_R, which is first inputted among the K periods, to a value A of the first delay update signal DELAY_UP_R, which is finally inputted, respectively. The logical combination unit 694 includes a NAND gate, a first transfer gate, an OR gate, a second transfer gate. The NAND gate is configured to perform a NAND operation on the outputs A, B, . . . , K of the K flip-flops. The first transfer gate is configured to output the output signal of the NAND gate according to the value A of the first delay update signal DELAY_UP_R. The OR gate is configured to perform an OR operation on the outputs A, B, . . . , K of the K flip-flops. The second transfer gate is configured to output the output signal of the OR gate according to an inversion value /A of the value A of the first delay update signal DELAY_UP_R. The number K of the flip-flops may be equal to or less than the number N of the reset signals.

Figure 9A:
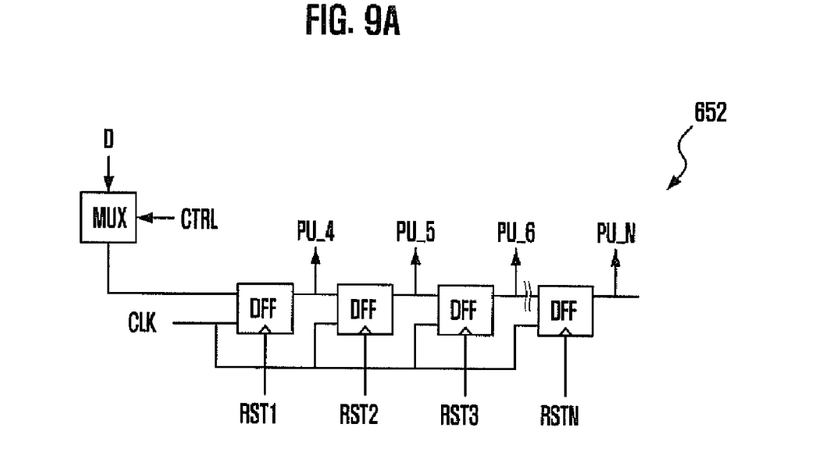
FIG. 9A is a circuit diagram illustrating a delay improvement control unit of FIG. 7.

FIG. 9A is a circuit diagram illustrating the delay improvement control unit 652 of FIG. 7.

Referring to FIG. 9A, the delay improvement control unit 652 includes a multiplexer and a plurality of flip-flops. The multiplexer is configured to transfer the internal periodic signal D in response to the control signal CTRL. The flip-flops are configured to receive the output signal of the multiplexer according to the period of the system clock CLK to output the periodic signals PU_4 to PU_N. The flip-flops are reset by the N reset signals RST<1:N>.

During the DLL operation, the first phase detector 620A continue to compare the phase of the feedback clock FB1 with the phase of the reference clock REF_CLK and outputs the first delay update signal DELAY_UP_R based on the comparison result. A value of the first delay update signal DELAY_UP_R may change continuously. If the delay value of the first delay line 656 changes whenever the value of the first delay update signal DELAY_UP_R changes, power consumption may increase excessively. Furthermore, when the phase difference between the feedback clock FB1 and the reference clock REF_CLK is not great, the output of the first phase detector 620A may be inconsistent due to the change in the amount of delay of the first delay line 656. Thus, the first phase detector 620A may repetitively output contradictory results. In this case, changing the delay value of the first delay line 656 according to the result may prevent the DLL circuit from going to the phase locked state. Hence, when the first phase detector 620A outputs the same results during several periods of the system clock CLK, it is determined that the first delay update signal DELAY_UP_R is valid and the delay improvement control unit 652 enables the first delay line control unit 654.

Furthermore, when some of the N reset signals are activated by the EMI control signal EMI_CONTROL, the flip-flops corresponding to the activated reset signals are reset. In this way, the phases of the periodic signals PU_4 to PU_N outputted from the delay improvement control unit 652 are changed and the timing of operation of the first delay line control unit 654 is changed.

Figure 9B:
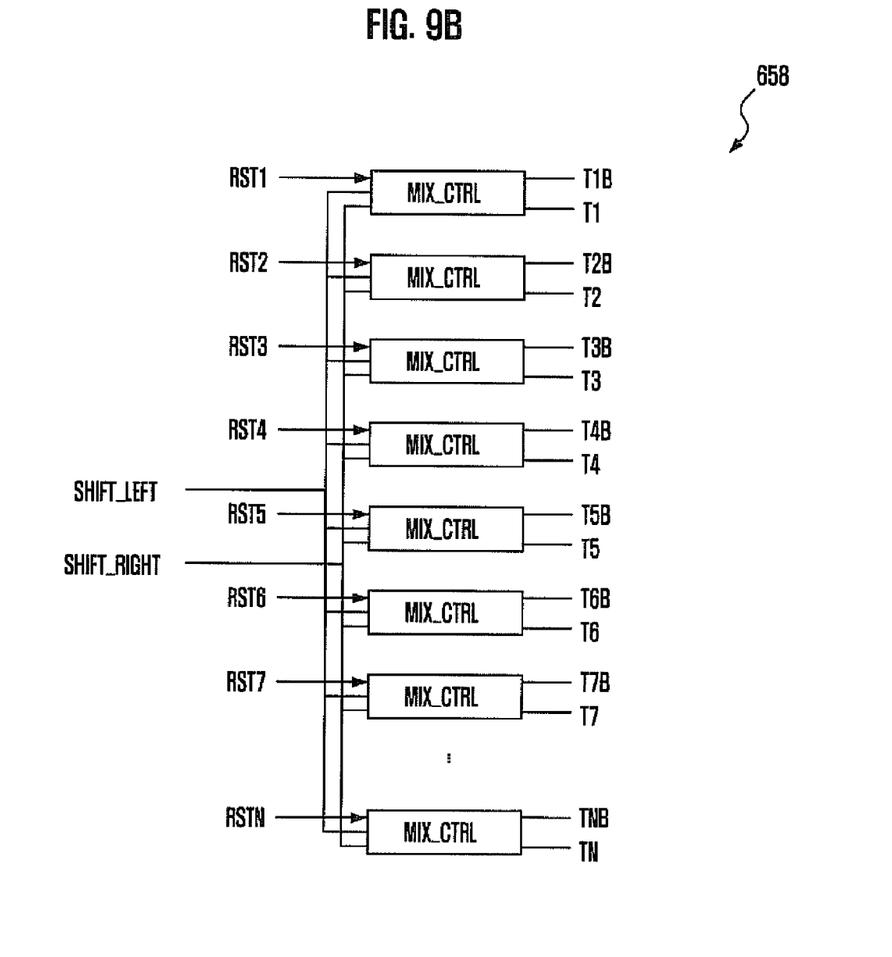
FIG. 9B is a block diagram illustrating a first mixer control unit of FIG. 7.

FIG. 9B is a block diagram illustrating the first mixer control unit 658 of FIG. 7.

Referring to FIG. 9B, the first mixer control unit 658 includes N unit phase mixer control units. The unit phase mixer control units receive the delay control signals SHIFT_LEFT and SHIFT_RIGHT from the first delay line control unit 654 and respectively outputs the fine control signals T1 and T1B, T2 and T2B, . . . , TN and TNB for controlling the unit phase mixers of the first mixing unit 659. The N unit phase mixer control units are reset by the activation of the N reset signals RST<1:N>.

When the DLL circuit is reset, the N reset signals RST<1: N> are all activated and thus the N unit phase mixer control units are reset. On the other hand, when some of the N reset signals RST<1:N> are activated by the EMI control signal EMI_CONTROL during the DLL operation, only a predetermined number of the unit phase mixer control units corresponding to the activated reset signals are reset. Thus, the number of the unit phase mixer control units enabled within first mixer control unit 658 is changed.

Figure 9C:
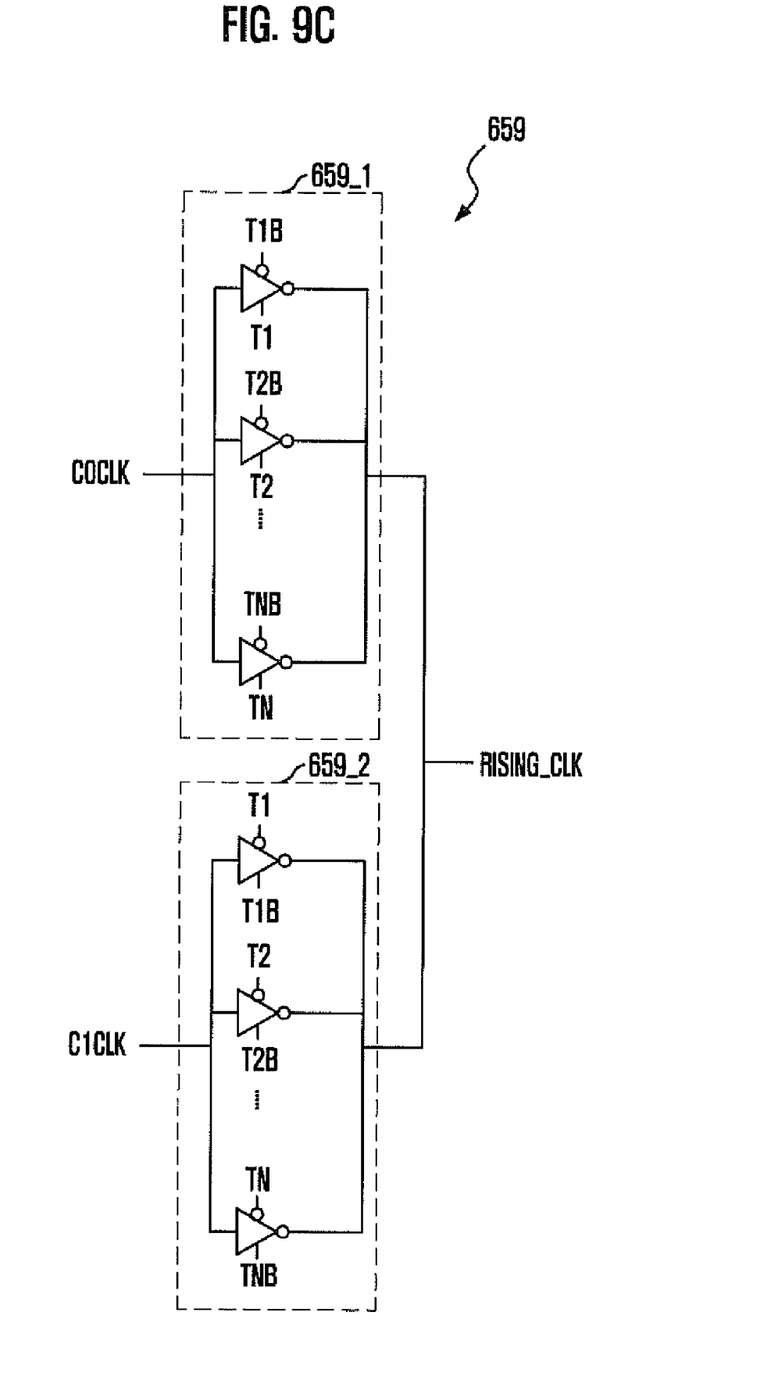
FIG. 9C is a circuit diagram illustrating a first mixing unit of FIG. 7.

FIG. 9C is a circuit diagram illustrating the first mixing unit 659 of FIG. 7.

Referring to FIG. 9C, the first mixing unit 659 includes a first phase mixer 659_1 and a second phase mixer 659_2. The first phase mixer 659_1 includes N first unit phase mixers that are respectively enabled in response to the fine control signals T1 and T1B, T2 and T2B, . . . , TN and TNB. The second phase mixer 659_2 includes N second unit phase mixers that are respectively enabled in response to inversion values T1B and T1, T2B and T2, . . . , TNB and TN of the fine control signals T1 and T1B, T2 and T2B, . . . , TN and TNB. The unit phase mixers of the first and second phase mixers 659_1 and 659_2 are disabled as many as the activated reset signals. The rising delay clock RISING_CLK is generated by combining the outputs of the first and second phase mixers 659_1 and 659_2.

The unit phase mixer is implemented with a 3-state inverter for controlling a transfer speed of an input signal in response to the fine control signal. The first phase mixer 659_1 includes N number of the unit phase mixer connected in parallel with respect to the first internal delay clock C0CLK, and the second phase mixer 659_2 includes N number of the unit phase mixer connected in parallel with respect to the second internal delay clock C1CLK. Since the N unit phase mixers connected in parallel have different signal drivability according to the fine control signals T1 and T1B, T2 and T2B, . . . , TN and TNB, they can change phase transition speed while phases of the first and second internal delay clocks C0CLK and C1CLK are changed, for example, at a rising edge or a falling edge. For example, the delay value of the first mixing unit 659 becomes minimum when the N unit phase mixers are all enabled to transfer the first internal delay clock C0CLK, and it becomes maximum when one unit phase mixer is enabled.

In a case where the EMI control signal EMI_CONTROL is deactivated, if M unit phase mixers in the first phase mixer 659_1 (where M is greater than 1 and less than N) are enabled, (N−M) unit phase mixers in the second phase mixer 659_2 are enabled, so that the unit phase mixers are operated symmetrically. The signals outputted from the first and second phase mixers 659_1 and 659_2 are merged to output the rising delay clock RISING_CLK. In this way, the first mixing unit 659 can achieve the phase control up to 1/N unit of the amount of delay of the unit delay elements included in the first delay line 656.

In a case where the EMI control signal EMI_CONTROL is activated, the unit phase mixers of the first phase mixer 659_1 are disabled as many as the number of the activated reset signals, whereas the unit phase mixers of the second phase mixer 659_2 are enabled as many. That is, the unit phase mixers of the first phase mixer 659_1 and the unit phase mixers of the second phase mixer 659_2 are operated asymmetrically. In this way, the rising delay clock RISING_CLK has a frequency band varying within a delay locking range, not a single frequency. Thus, the semiconductor memory device can prevent EMI caused by the rising delay clock RISING_CLK. Furthermore, the phase of the output of the first delay line 656 is controlled without departing from the range for compensating the delay value of the system clock within the semiconductor memory device through the DLL operation. Malfunction is not generated even when the rising delay clock RISING_CLK whose frequency is not locked is used as data output reference.

Figure 10:
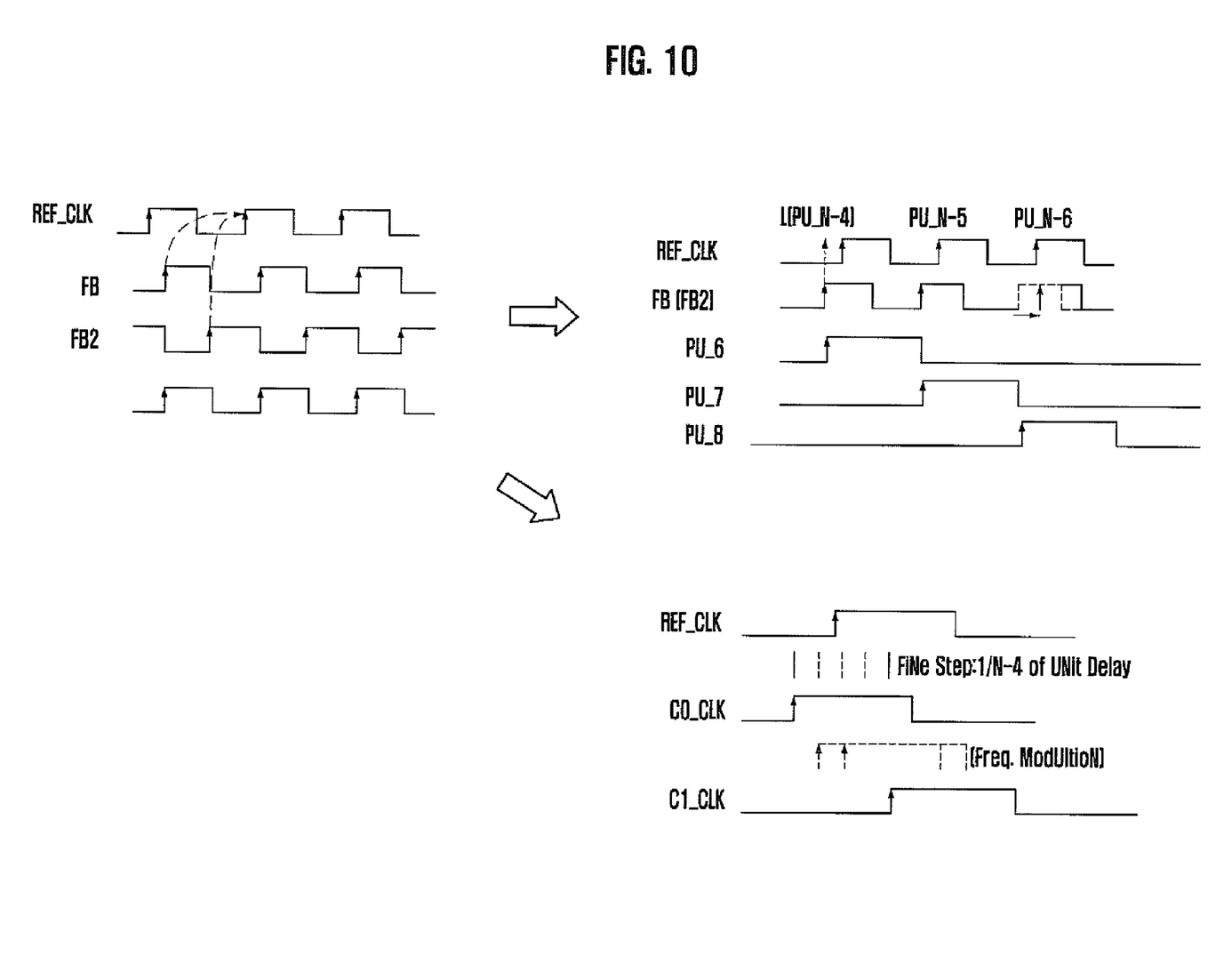
FIG. 10 is a timing diagram illustrating the operation of the semiconductor memory device of FIG. 6.

FIG. 10 is a timing diagram illustrating the operation of the semiconductor memory device of FIG. 6.

Referring to FIG. 10, the first phase detector 620A compares the phase of the reference clock REF_CLK with the phase of the first feedback dock FB1, and the second phase detector 620B compares the phase of the reference clock REF_CLK with the phase of the second feedback clock FB2. When the comparison results of the first phase detector 620A are equal during a predetermined period, the phases of the periodic signals PU_4 to PU_N from the delay improvement control unit 652 are changed due to the activation of some of the N reset signals. Thus, the timing of operation of the first delay line control unit 654 for controlling the amount of delay of the first delay line 656 is changed.

In addition, when the EMI control signal EMI_CONTROL is inactivated, the first mixing unit 659 finely readjusts the phases of the first and second internal delay clocks C0CLK and C0CLK outputted from the first delay line 656. However, assuming four reset signals are activated when the EMI control signal EMI_CONTROL is activated, the phase control can be done up to 1/(N−4) unit of the amount of delay of the unit delay elements included in the first delay line 656 because the four unit phase mixers of the first mixing unit 659 are disabled. Therefore, the phase and frequency of the rising delay clock RISING_CLK outputted from the first mixing unit 659 are different from those before the EMI control signal EMI_CONTROL is activated.

In accordance with the embodiments of the present invention, the DLL circuit of the semiconductor memory device can detect the conditions that may cause EMI, and change the phases and frequencies of the rising and falling DLL clocks RCLKDLL and FCLKDLL whose phases are finely controlled. Therefore, the power of the rising and falling DLL clocks RCLKDLL and FCLKDLL having high frequencies can be prevented from exceeding the FCC limit by spread spectrum that can make the rising and falling DLL clocks RCLKDLL and FCLKDLL have the frequency band within the delay locking range. Thus, malfunctions of the internal components due to the EMI can be prevented.

As described above, when the semiconductor memory device uses a clock with high frequency, it can suppress EMI that may be caused when the DLL clock is fixed to only one frequency. Furthermore, since the phase of the DLL clock is not fixed, malfunction of peripheral components due to EMI can be prevented, thereby improving the reliability of the operation of the semiconductor memory device.

Moreover, by compensating the delay time of the clock, the phase of the DLL clock can be changed within the delay locking range for controlling the data input/output timing. Consequently, the data input/output timing of the high-speed semiconductor memory device can be stably ensured.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising a delay locked loop (DLL) circuit configured to receive a system clock and to make a DLL clock have a frequency band within a delay locked range by changing a phase of the DLL clock in response to an electromagnetic interference (EMI) control signal.

2. The semiconductor memory device as recited in claim 1, further comprising an EMI control unit configured to output the EMI control signal to the DLL circuit so as to perform spread spectrum on the DLL clock when EMI occurs.

3. The semiconductor memory device as recited in claim 2, wherein the DLL circuit includes:
    an input buffer configured to buffer the system clock to output an internal clock;
    a phase detector configured to compare a phase of the internal clock with a phase of a feedback clock to output a comparison result;
    a delay unit configured to delay the phase of the internal clock in response to outputs of the phase detector and the EMI control unit;
    a duty cycle ratio controller configured to control duty cycle ratios of rising and falling delay clocks outputted from the delay unit;
    a replica delay line configured to feed back an output of the duty cycle ratio controller to generate the feedback clock; and
    a phase separator configured to output the DLL clock based on the output of the duty ratio controller.

4. The semiconductor memory device as recited in claim 3, wherein the EMI control unit includes a result storing unit configured to store K outputs of the phase detector during K periods of the system clock, and a logical combination unit configured to determine that the EMI is radiated above a predetermined reference level when the stored K outputs are equal to one another, K being a natural number.

5. The semiconductor memory device as recited in claim 3, wherein the delay unit includes:
    a reset control unit configured to activate a predetermined number of N reset signals in response to the output of the EMI control unit, N being a natural number;
    a delay line configured to delay the internal clock through a plurality of unit delay elements;
    a delay line control unit configured to control an amount of delay of the delay line according to the output of the phase detector;
    a delay update control unit configured to determine a period of operation of the delay line control unit according to an output of the reset control signal;
    a mixer control unit configured to output fine control signals for spreading a frequency band of the DLL clock according to the outputs of the reset control unit and the delay line control unit; and
    a mixing unit including N first unit phase mixers and N second unit phase mixers and configured to control the phase of the output signal of the delay line by up to 1/N unit of an amount of delay of the unit delay element according to the fine control signals, and to output the rising and falling delay clocks.

6. The semiconductor memory device as recited in claim 1, further comprising a data output circuit configured to output data in synchronization with the DLL clock.

* * * * *